(12) United States Patent
Weber

(10) Patent No.: US 9,714,970 B2
(45) Date of Patent: Jul. 25, 2017

(54) METHOD FOR MEASURING THE PRESENCE OF A HIGH-VOLTAGE AND ESTABLISHING THE ABSENCE OF VOLTAGE

(71) Applicant: Bayerische Motoren Werke Aktiengesellschaft, Munich (DE)

(72) Inventor: Martin Weber, Altomuenster (DE)

(73) Assignee: Bayerische Motoren Werke Aktiengesellschaft, Munich (DE)

(*) Notice: Subject to any disclaimer, the term of this patent is extended or adjusted under 35 U.S.C. 154(b) by 127 days.

(21) Appl. No.: 14/696,938

(22) Filed: Apr. 27, 2015

(65) Prior Publication Data

US 2015/0226778 A1   Aug. 13, 2015

Related U.S. Application Data

(63) Continuation of application No. PCT/EP2013/072161, filed on Oct. 23, 2013.

(30) Foreign Application Priority Data

Oct. 25, 2012   (DE) .................. 10 2012 219 559

(51) Int. Cl.
*G01R 31/00* (2006.01)
*B60L 3/00* (2006.01)
(Continued)

(52) U.S. Cl.
CPC .............. *G01R 31/006* (2013.01); *B60L 3/00* (2013.01); *B60L 3/12* (2013.01); *G01R 19/0084* (2013.01); *G01R 19/155* (2013.01); *Y02T 90/16* (2013.01)

(58) Field of Classification Search
CPC combination set(s) only.
See application file for complete search history.

(56) References Cited

U.S. PATENT DOCUMENTS

| 7,252,165 B1 | 8/2007 | Gruenwald et al. |
| 2009/0078521 A1* | 3/2009 | Ohtomo ............ B60L 3/0092 191/12 R |

(Continued)

FOREIGN PATENT DOCUMENTS

| DE | 10 2010 048 985 A1 | 4/2012 |
| WO | WO 2011/103550 A1 | 8/2011 |

(Continued)

OTHER PUBLICATIONS

International Search Report (PCT/ISA/210) dated Jul. 28, 2014 with English translation (five pages).

(Continued)

*Primary Examiner* — Clayton E Laballe
*Assistant Examiner* — Jas Sanghera
(74) *Attorney, Agent, or Firm* — Crowell & Moring LLP

(57) ABSTRACT

A method is provided for indicating a presence of a high voltage at a high-voltage component equipped in a vehicle. The method includes the steps of connecting an external reader to a communication bus of the vehicle, outputting a signal by way of the high-voltage component or by way of a component control unit which is connected to the high-voltage component, to the communication bus, wherein the signal indicates whether a high voltage is present at the high-voltage component, and reading the signal from the communications bus by way of the external reader.

11 Claims, 1 Drawing Sheet

(51) Int. Cl.
*B60L 3/12* (2006.01)
*G01R 19/00* (2006.01)
*G01R 19/155* (2006.01)

(56) References Cited

U.S. PATENT DOCUMENTS

2013/0264994 A1 10/2013 Schaefer
2013/0293237 A1 11/2013 Thoemmes

FOREIGN PATENT DOCUMENTS

| WO | WO 2011/126909 A2 | 10/2011 |
| WO | WO 2012/084102 A1 | 6/2012 |

OTHER PUBLICATIONS

German Search Report dated Jun. 21, 2013 with partial English translation (nine pages).

\* cited by examiner

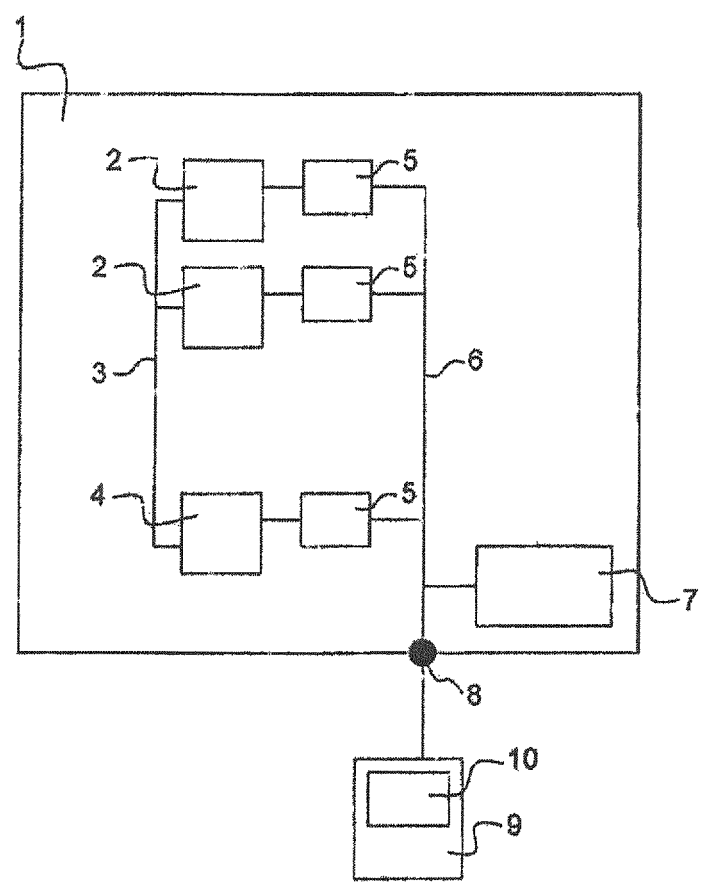

METHOD FOR MEASURING THE PRESENCE OF A HIGH-VOLTAGE AND ESTABLISHING THE ABSENCE OF VOLTAGE

CROSS REFERENCE TO RELATED APPLICATIONS

This application is a continuation of PCT International Application No. PCT/EP2013/072161, filed Oct. 23, 2013, which claims priority under 35 U.S.C. §119 from German Patent Application No. 10 2012 219 559.9, filed Oct. 25, 2012, the entire disclosures of which are herein expressly incorporated by reference.

BACKGROUND AND SUMMARY OF THE INVENTION

The invention relates to a method for measuring a presence of a high voltage at a high-voltage component fitted in a vehicle. The method can be used, in particular, for establishing the absence of voltage on the vehicle.

Vehicles can nowadays have components which operate on a high voltage so that there is a high voltage present at these components in a switched-on state. For reasons of occupant safety, it is critical to be able to check at any time whether a high voltage is present in the vehicle. For example, it is possible to establish whether the vehicle is free of voltage potential prior to performing any work on the vehicle. Only in this way is it possible to ensure that a mechanic, whilst performing repair work on the vehicle, or a development engineer in a development and/or test phase of the vehicle, is warned against inadvertently touching a high voltage which is present.

Some vehicles have a built-in diagnostic system for this purpose, which diagnostic system is connected to the high-voltage components and checks for the presence of a high voltage. However, it is not always possible to be able to rely on this diagnostic system. For example, the diagnostic system could operate in an unreliable manner in various stages of the development process of the vehicle or the diagnostic system could have been damaged as a result of an accident or a defect, with the result that both a development engineer during testing and a mechanic during repair work on the vehicle cannot always rely on the indications of the diagnostic system.

One object of the present invention therefore is to overcome the above-mentioned disadvantages of the diagnostic system. A further object is to provide a method which makes it possible to be able to check for the presence of a high voltage at a high-voltage component at any time and/or to establish the absence of voltage.

These and other objects are achieved by a method for indicating a presence of a high voltage at a high-voltage component equipped in a vehicle. This method comprises the following steps: connecting an external reader to a communications bus of the vehicle; outputting a signal by way of the high-voltage component or by way of a component control unit, which is connected to the high-voltage component, to the communications bus, wherein the signal indicates whether a high voltage is present at the high-voltage component; and reading the signal from the communications bus by way of the external reader.

The signal which is output by the high-voltage component or by the component control unit, which is connected to the high-voltage component, to the communications bus can indicate the value of the voltage present at the high-voltage component.

The read signal can be displayed by the external reader. The external reader can read and display a plurality of signals of different components.

Correspondingly, the signal which indicates a presence of a high voltage is output by the high-voltage component or by a component control unit, which identifies a presence of a high voltage at the high-voltage component.

For this purpose, the high-voltage component at which a high voltage could be present can be connected directly to the communications bus and can transmit a signal to the communications bus which indicates whether a high voltage is present at the high-voltage component at that time.

As an alternative to this, the vehicle can have a component control unit, which is assigned to the high-voltage component, wherein the high-voltage component is not itself connected to the communications bus. Instead, the component control unit is connected to the communications bus. The component control unit can identify whether a high voltage is present at the high-voltage component and can output a corresponding signal with this information to the communications bus.

In particular, the signal output by the high-voltage component or by the component control unit can be the signal with which the high-voltage component or the component control unit also communicates with the diagnostic system. Correspondingly, no modifications to the high-voltage component or the component control unit are required for the inventive method.

In contrast to a communication with the diagnostic system, the external reader makes it possible to communicate directly on a component level with the high-voltage component or with a component control unit, which is connected to the high-voltage component. Even when the diagnostic system should not function, the high-voltage component or the component control unit will nevertheless output the corresponding signal to the communications bus, so that communication with the external reader remains possible. Correspondingly, the reliability of the check for a presence of a high voltage at a high-voltage component is increased. As a result, the operational safety, for example for a mechanic during repair work on a vehicle or a development engineer during development of the vehicle, can be decisively increased.

The signal is now read by an external reader as an alternative to or in addition to reading by the built-in diagnostics system. The term "external" should in this case be understood to mean that the reader is not built into the vehicle. The reader is accordingly not a permanent part of the vehicle. The reader can instead be connected to a connection of the communications bus, which is built into the vehicle. In order to connect the external reader, therefore, no modification to the vehicle is required. Instead, the communications bus which is used for the communication between the high-voltage component and the diagnostic system can also be used for communication with the external reader.

The connection of the communications bus can be a connection which is provided as standard in a test vehicle. The connection of the communications bus can alternatively be a connection which is installed as a one-off. In addition, the connection of the communications bus can be a temporary connection. As an alternative to this, the connection of the communications bus can be a connection which is provided in any vehicle. The term "any vehicle" should in this case be understood to mean that it is not a test vehicle but a standard vehicle.

In addition, the inventive method has the advantage that the structure of the vehicle does not need to be modified or influenced. In order to connect the external reader, for example, no additional holes need to be incorporated in the vehicle body. Correspondingly, the crash behavior of the vehicle is not impaired by the method.

The external reader is a small handy device which can display the output signal which indicates a presence of a high voltage.

In this case, the method is not restricted to one high-voltage component. Instead, a plurality of high-voltage components or a plurality of component control units, which each output a signal which indicates whether a high voltage is present at the respective high-voltage component, can be connected to the communications bus.

In addition, the method can include the step of outputting a warning signal by the external reader if a high voltage is present at the high-voltage component. As a result, a development engineer or a mechanic can be warned of the presence of a high voltage in good time. The warning signal may be, for example, an audible or visual signal.

In addition, the reader can have a display screen, on which the read signal is displayed. Correspondingly, it is possible to identify directly on the display screen whether a high voltage is present at one of the high-voltage components of a vehicle.

The communications bus can be a controller area network (CAN) bus system or another communications bus.

The vehicle can have an electric drive. In particular in the case of vehicles with an electric drive, components which require a high voltage are present. The components may be, for example, the battery of the vehicle or components of the drive electronics of the vehicle.

The external reader can be suitable for use in different vehicles. For this purpose, the external reader can have a menu from which a user can select the respective vehicle to whose communications bus the external reader is connected.

The method described herein can be used to establish whether the vehicle is free of voltage potential.

Other objects, advantages and novel features of the present invention will become apparent from the following detailed description of one or more preferred embodiments when considered in conjunction with the accompanying drawing.

BRIEF DESCRIPTION OF THE DRAWING

FIG. 1 is a schematic block diagram of an exemplary vehicle having a number of high-voltage components.

DETAILED DESCRIPTION OF THE DRAWING

The vehicle 1 shown schematically in FIG. 1 has a plurality of high-voltage components 2, which are operated on a high voltage. The high-voltage components 2 may be, for example, a battery or components of the drive electronics of the vehicle. The high-voltage components 2 are connected to a voltage supply system. The high-voltage components 2 are connected to a voltage source 4 via this voltage supply system 3. The voltage source 4 may likewise be a high-voltage component 2. In particular, the voltage source 4 can be a battery. If a respective high-voltage component 2 is activated, a high voltage is present at the high-voltage component via the voltage supply system 3.

In addition, the vehicle 1 has component control units 5, wherein a component control unit 5 is assigned to each high-voltage component 2. The component control units 5 are configured so as to identify whether a high voltage is present at the respective high-voltage component 2. The component control units 5 can measure the voltage present at the high-voltage component 2 for this purpose.

Alternatively, the component control units 5 are configured to transmit control commands to the respective high-voltage component 2, so that the component control unit 5 knows, on the basis of the control command most recently transmitted in each case, whether a high voltage is present at the high-voltage component 2.

The component control units 5 are connected to a communications bus 6. The communications bus 6 is furthermore connected to a diagnostic unit 7, which is built into the vehicle 1. The component control units 5 transmit signals via the communications bus 6, with there being an indication in said signals as to whether a high voltage is present at the respective high-voltage component 2.

In addition, the communications bus has a connection 8, to which an external reader 9 is connectable. If, as shown in FIG. 1, the external reader 9 is now connected to this connection 8, said external reader can communicate with the component control units 5 via the communications bus 6. In particular, the external reader 9 can receive the signals from the component control units 5, in which signals there is an indication as to whether a high voltage is present at the respective high-voltage component 2.

In addition, the external reader 9 has a display screen 10, on which there is a visual display as to whether a high voltage is present at the respective high-voltage component 2.

Alternatively, the high-voltage components 2 could be connected to the communications bus 6 and could output a signal to said communications bus, in which signal an indication is given in each case as to whether a high voltage is present at the respective high-voltage component 2.

In one embodiment, a plurality of high-voltage components 2 can be assigned to one component control unit 5.

In one embodiment, the high-voltage component 2 and the component control unit 5 assigned thereto can be installed in a common housing or be combined in a common device.

In one embodiment, the voltage source 4 and the component control unit 5 assigned thereto can be installed in a common housing or be combined in a common device.

In one embodiment, the diagnostic unit 7 can be integrated in a component control unit 5 assigned to a high-voltage component 2.

In one embodiment, the diagnostic unit 7 can transmit information relating to a central display unit in the vehicle.

LIST OF REFERENCE SYMBOLS

1 Vehicle
2 High-voltage component
3 Voltage supply system
4 Voltage source
5 Component control unit
6 Communications bus
7 Diagnostic system
8 Connection
9 External reader
10 Display screen The foregoing disclosure has been set forth merely to illustrate the invention and is not intended to be limiting.

Since modifications of the disclosed embodiments incorporating the spirit and substance of the invention may occur to persons skilled in the art, the invention should be construed to include everything within the scope of the appended claims and equivalents thereof.

What is claimed is:

1. A method for indicating a presence of a high voltage at a component equipped in a vehicle, the method comprising the acts of:
    providing one or more high-voltage components in the vehicle;
    outputting, onto a communication bus of the vehicle, by a respective high-voltage component or a component control unit coupled to the respective high-voltage component, a signal indicative of whether a high voltage is present at the respective high-voltage component; and
    communicating the signal directly from the respective high-voltage component or component control unit coupled to the respective high-voltage component to an external reader, via the communication bus, that is connected to an interface of the vehicle.

2. The method according to claim 1, further comprising the acts of:
    connecting the external reader to the communication bus via the interface; and
    reading the signal, via the external reader, from the communication bus.

3. The method according to claim 2, further comprising the act of:
    outputting, via the external reader, a warning signal if the signal indicates the high voltage is present at the respective high-voltage component.

4. The method as according to claim 3, further comprising the act of:
    displaying the signal, following said reading the signal, on a display screen of the external reader.

5. The method according to claim 2, further comprising the act of:
    displaying the signal, following said reading the signal, on a display screen of the external reader.

6. The method according to claim 1, wherein the communication bus is a controller area network bus system.

7. The method according to claim 6, wherein the vehicle has an electric drive.

8. The method according to claim 1, wherein the vehicle has an electric drive.

9. The method according to claim 1, further comprising the act of establishing whether the vehicle is free of voltage potential based upon the signal.

10. The method according to claim 1,
    wherein providing one or more high-voltage components in the vehicle comprises providing a plurality of high-voltage components in the vehicle, and
    wherein outputting, onto the communication bus of the vehicle, by the respective high-voltage component or the component control unit coupled to the respective high-voltage component, said signal further comprises outputting, onto the communication bus of the vehicle, by the plurality of high-voltage components or component control units coupled to corresponding ones of the plurality of high-voltage components, a plurality of signal indicative of whether high-voltages are present at corresponding ones of the plurality of high-voltage components.

11. The method according to claim 10,
    wherein communicating the signal directly from the respective high-voltage component or component control unit coupled to the respective high-voltage component to the external reader comprises communicating said plurality of signals directly from the respective high-voltage components or component control unit coupled to corresponding one of the plurality of high-voltage components to the external reader, via the communication bus, that is connected to the interface of the vehicle.

* * * * *